United States Patent [19]

Peil

[11] 3,723,895

[45] Mar. 27, 1973

[54] AMPLIFIER OF CONTROLLABLE GAIN

[75] Inventor: William Peil, North Syracuse, N.Y.

[73] Assignee: General Electric Company

[22] Filed: Nov. 10, 1971

[21] Appl. No.: 197,390

[52] U.S. Cl. ....................................330/29, 330/30 D

[51] Int. Cl. ................................................H03g 3/30

[58] Field of Search ...................330/20, 29, 30 D, 69

[56] References Cited

UNITED STATES PATENTS 3,482,177 12/1969 Sylvan ...............................330/69 X

FOREIGN PATENTS OR APPLICATIONS 1,153,077 8/1963 Germany ...............................330/69

*Primary Examiner*—Roy Lake
*Assistant Examiner*—James B. Mullins
*Attorney*—Richard V. Lang et al.

[57] ABSTRACT

An amplifier of controllable gain which is d.c. coupled throughout and capable of wide band operation is described. It employs a cascode differential amplifier first stage and a differential amplifier second stage for producing the principal voltage gain of the amplifier. Control of the gain of the cascode differential amplifier is achieved by the application of gain control potentials to the bases of the cascoded upper rank transistors. Gain reduction is successively produced by saturation of the lower rank transistors, the degenerative effects of two impedances connected in series with the base leads of the lower rank transistors, and finally by cut-off of the upper rank transistors. The resultant gain control characteristic has a steep initial, gradual central and a steep final slope. The total range of gain control is in excess of the forward gain of the amplifier. The amplifier is of high gain and wide bandwidth and is suitable for amplification at intermediate frequencies (44 megahertz) of a television signal. The circuit is adapted for integrated circuit fabrication.

4 Claims, 2 Drawing Figures

AMPLIFIER OF CONTROLLABLE GAIN

BACKGROUND OF THE INVENTION

1. Field of the Invention

The present invention relates to d.c. coupled amplifiers capable of wide band operation and more particularly to an amplifier of electrically controllable gain. The amplifier is adapted for amplification of a television signal at customary intermediate frequencies, with the amplification being subject to control as a function of the signal level in a subsequent detection state. The amplifier is compatible with integrated circuit fabrication techniques.

2. Description of the Prior Art

In a conventional television receiver, amplification of a television signal occurs at a typical "intermediate" frequency of 44 megahetz. Amplification has normally been achieved by a succession of tuned amplifier stages, each stage operating with a.c. coupling between the stages, the coupling being tuned to permit amplification of only a narrow band of signals. With the advent of integrated circuit technology, it has been particularly desirable to avoid the periodic insertion of filtering, which could not be integrated, between stages of amplification, which could be integrated. This has led to the suggestion to establish the requisite filtering in a "lump" off the chip and the gain in another "lump" on the chip. Within the chip, a.c. coupling, whether broadband or narrow, has been less desirable than d.c. coupling.

Thus, with the advent of integrated circuits, it became desirable to develop d.c. coupled amplifiers for tasks previously assigned to a.c. amplifiers. The customary requirements of such a.c. amplifiers have not been met by existent d.c. amplifiers. Assuming that a d.c. amplifier will be employed for the amplification of the relatively high frequency signals in a television IF amplifier, one must provide the necessary high frequency response, amplification linearity, balance, noise figure and automatic gain control features that this application requires.

The present invention is an improvement over an earlier invention of Peil and Hesler filed Aug. 6, 1971, Ser. No. 169,642, entitled "Amplifier of Controllable Gain. The earlier filed application describes an amplifier employing two differential amplifiers, with interspersed buffer amplifiers, and a d.c. balancing feedback network. Gain control is achieved by controls applied to both differential amplifier stages.

SUMMARY OF THE INVENTION

It is a principal object of the invention to provide an amplifier having improved gain control action.

It is another object of the invention to provide a differential amplifier having improved gain control action.

It is still another object of the invention to provide a d.c. coupled amplifier having a high frequency response and a wide range of gain control action.

It is still a further object of the invention to provide an amplifier suitable for integrated circuit fabrication having improved gain control action.

It is still another object of the invention to provide a d.c. coupled amplifier suitable for use as the gain element in an intermediate frequency amplifier of a television receiver.

These and other objects of the invention are achieved in a combination comprising a first pair of transistors, each transistor having base, emitter and collector electrodes connected in differential amplifier configuration, the transistors being biased to have a low initial collector emitter voltage ($V_{ce}$) for sensitivity to collector saturation effects. A second pair of transistors is provided each having base, emitter and collector electrodes connected in cascode with the first transistor pair, the emitters of the second pair being coupled to the collectors of the first pair; and the output signal appearing at the collectors of the second pair. A source of gain control potential is coupled to the bases of the second transistor pair which reduces the base potentials and by emitter follower action the collector potentials of the first transducer pair to produce initial gain reduction by saturating the first transistor pair by reducing the collector emitter voltage. Subsequently, the control produces gain reduction by driving the second transistor pair into cut off. These control mechanisms produce the steep initial and final slopes in the AGC characteristic. A degenerative impedance is coupled into the base leads of the first transistor pair to effect a greater range of gain control reduction with minimum loss of signal noise ratio, the gain reduction effect taking place as the first stage goes into saturation and the voltage division ratio between the base connected resistors and the transistor input impedances begin to increase. This control helps produce the gradual central slope of the AGC characteristic.

In accordance with another aspect of the invention, the cascode amplifier stage which is subject to automatic gain control is followed by a second stage of amplification, not subject to gain control. D.C. balance in the amplifier, which is d.c. coupled throughout, is achieved irrespective of the degree of gain control reduction in the first stage by providing a buffer amplifier at the input of the first stage, which acts as an emitter follower in coupling the signal into the first transistor pair, but which upon saturation of the cascode transistor stage under high AGC control, translates the unbalance feedback signal to the output of the cascode stage, where it continues to provide d.c. balance to the subsequent amplification stage.

In its preferred form, the two signal amplifying stages are in differential configuration with d.c. coupled emitter follower stages acting as input and output buffer amplifiers. The d.c. balance feedback network is provided with an output buffer in a circuit which allows the thermal drift of the d.c. feedback network to compensate for drift in the cascode input stage. This is achieved by providing a pair of serially connected forward biased diodes and resistance means in the output of the d.c. feedback network which compensates for drift of the cascode input stage.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

DESCRIPTION OF THE PREFERRED EMBODIMENT

Figures 1, 2:
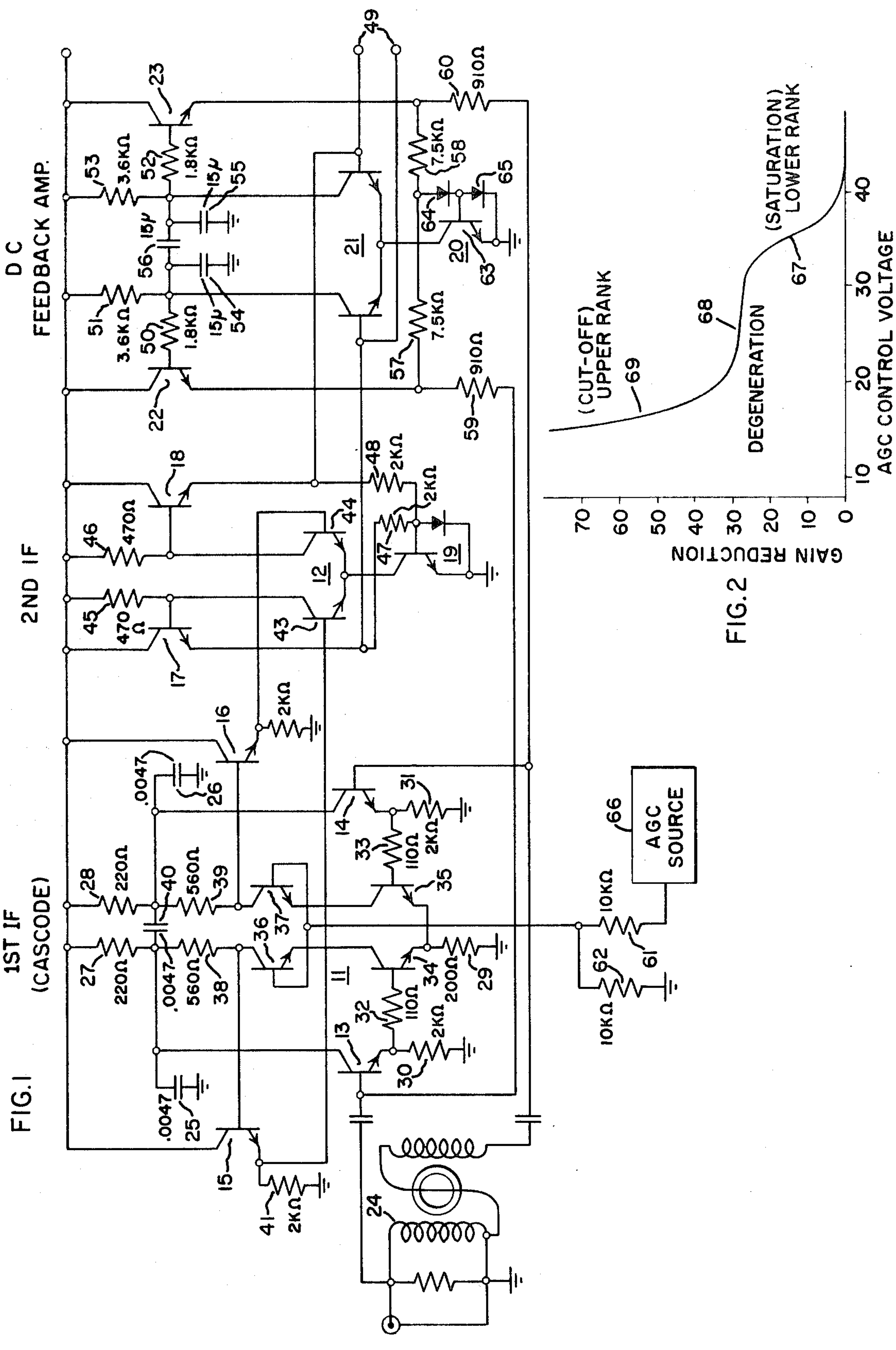
FIG. 1 is a circuit diagram of an amplifier in accordance with the invention, which is of controllable gain and suitable for use as the amplifier of a television signal at customary intermediate frequencies.
FIG. 2 is a graph of the gain control characteristic of the cascode input stage.

Referring now to FIG. 1, a circuit diagram is provided of a d.c. amplifier in accordance with the invention employed as an intermediate frequency amplifier for a television receiver. This intermediate frequency amplifier differs from conventional IF amplifiers for television receives in that the filtering is achieved by a lumped filter containing all the IF selectivity prior to the amplifier. The amplifier itself passes all the components of a selected television channel without substantial relative attenuation. The IF amplifier may be used to supply an amplified signal to a suitable video detector. The amplifier has balanced input connections, balanced output connections and a balanced d.c. interstage signal coupled throughout.

The amplifier consists of a cascode differential amplifier stage 11, a second differential amplifier stage 12, supplemented by three pairs of buffer amplifiers 13–14, 15–16, 17–18; a d.c. feedback network comprising the differential amplifier 21 and a pair of buffer amplifiers 22, 23; and current supply elements 19, 20.

A balanced input to the amplifier is obtained from an IF filter, not shown, by means of a "balun" 24. The balun may take the form of a coil having two matched bifilar windings. Connections to the windings are made by a pair of ungrounded terminals and a ground connection. When an input signal is applied between one ungrounded terminal and ground, causing signal current in one winding, an equal signal current is induced in the other winding, producing at the other ungrounded terminal a corresponding signal, which is of equal magnitude but out of phase. The balun produces an output signal, which is balanced to ground. The balanced signal is coupled from the balun 24 through a pair of coupling capacitors to the transistor bases of the first pair of buffer amplifiers 13, 14. From this point on, the amplifier employs only d.c. signal coupling.

The paired input buffer amplifiers 13, 14 are emitter followers having their collectors bypassed to ground by capacitors 25, 26, and connected through resistors 27, 28 to a 5 volt source of bias potentials. Their emitters, from which a balanced output signal is derived, are connected, respectively, to ground through load resistances 30, 31. The output signal taken from the emitters of buffer amplifiers 13, 14 is then fed through a pair of degenerative resistances 32, 33 to the balanced signal input connections of the cascode differential amplifier 11.

The cascode differential amplifier 11 consists of four transistors 34–37. The emitters of lower rank transistors 34, 35 are connected together to ground through the current stabilizing resistance 29. The bases of transistors 34, 35 are connected to the resistance 32, 33 for the input signal connection, and the collectors of 34, 35 from which the balanced output signal is derived, are coupled to the emitters of the cascoded upper rank transistors 36 and 37. The bases of the transistors 36 and 37 are joined and connected through resistance 61 to the source 66 of IF AGC voltage. The bases are also grounded through a second resistance 62. The collectors of the transistors 36 and 37 are connected through load resistances 38 and 39 and resistances 27, 28 to the 5 volt source. A capacitor 40 is provided connected between the connection points of resistances 38 and 27 and 39 and 28, respectively.

Following the cascode differential amplifier 11, a second pair of buffer amplifiers 15, 16 is provided for coupling the balanced output signal from the cascode differential amplifier 11 to the differential amplifier 12. The buffer amplifiers 15, 16 comprise two transistors connected in emitter follower configuration. The bases of these transistors are connected to the output collectors of transistors 36 and 37 of cascode differential amplifier 11; the collectors are directly connected to the source of bias potentials; and the emitters, from which a balanced input into the second differential amplifier 12 is obtained, are connected to ground through load resistances 41, 42.

The differential amplifier 12 consists of two differentially connected transistors 43, 44, each having their bases connected to the output emitters of the buffer amplifiers 15, 16. The collectors of transistors 43, 44, from which a balanced output signal is applied to the bases of output buffer amplifiers 17, 18, are coupled through suitable load resistances 45, 46 to the source of bias potentials. The emitters of transistors 43, 44 are joined and connected to a constant current source 19. The differential amplifier 12 is not subject to automatic gain control and is operated at fixed gain.

The third pair of buffer amplifiers 17, 18 are also in emitter follower configuration. The collectors of 17, 18 are connected to the B+ source, and the emitters are returned to ground through load resistances 47, 48. The output terminals 49 of the amplifier are connected to the emitters of 17, 18. The buffer amplifiers 17, 18 couple the balanced output signal from the second differential amplifier 12 to the signal output terminals 49 of the amplifier.

The d.c. feedback network (comprising the elements 20–23, 50–60) maintains a low d.c. offset in the amplifier output leads through a negative differential feedback connection. The feedback network comprises a differential amplifier 21 of high gain at low frequencies. The emitters of amplifier 21 are connected to the current source 20 which comprises a transistor 63 and a diode series pair 64, 65. The current source 20 derives its reference current by a current path passing through buffer amplifiers 22, 23 and two resistances 57, 58 connected together to the anode of the diode 64. The cathode of diode 64 is in turn connected to the anode of diode 65 whose cathode is in turn grounded. The transistor 20 has its base connected to the junction between series connected diode 64 and 65 and its emitter grounded. Connection of the emitters of amplifier 21 to the collector of transistor 63 provides stabilized current to the amplifier 21.

The collectors of amplifier 21 are coupled to the bases of buffer amplifiers 22, 23 through a pair of biasing resistances 50, 52. A second pair of resistances 51 and 53 connected between the collectors of 21 and B+ provide collector loads. A pair of bypass capacitors 54 and 55 are coupled between the collectors of 21 and ground and a third bypass capacitor 56 is coupled between the output collectors.

The buffer amplifiers 22, 23 are also in emitter follower configuration. The collectors of 22, 23 are connected to B+, and the emitters are coupled through resistances 57, 58 to the series diode string of current source 20 as previously noted. The output signal from 22, 23 indicative of amplifier unbalance is then fed through serially connected resistors 59 and 60 to the bases of the input buffers 13, 14.

The signal existing at the output of the differential amplifier 12 has two principal components; a d.c. component of the differential output signal; and the balanced a.c. output signal of interest. (The common mode d.c. level component resulting from gain control action on stage 11 is blocked in the second stage 12.) The d.c. component of the different output is a measure of amplifier offset and this signal is fed back to stabilize the amplifier and minimize the offset voltage at the output. The balanced a.c. output signal, if fed back to the input, would affect the amplifier a.c. gain and adversely affect amplifier stability. AC feedback is generally removed from the feedback loop by the low pass filter action of capacitors 54, 55, 56 in conjunction with the resistors 50, 52.

It is important to maintain a low d.c. offset in the output leads. If the amplifier 21 were not present, the loop gain for d.c. biasing ($\mu\beta$) would become too low under maximum gain control conditions to maintain effective feedback and insure a low offset voltage. With the present arrangement, a minimum of approximately 30 db of differential d.c. feedback is present as a result of the gain in amplifier 21. As will be explained, balancing action is achieved under all conditions of AGC control.

The amplifier stages 11, 12 provide the approximately 53 db voltage gain of the amplifier, the first stage having approximately 28 db of gain and the second stage approximately 25 db of gain. The cascoded differential amplifier 11 has greater gain than one can obtain from a differential amplifier alone; the increase in gain of the combination being normally about 6 db greater than that of the differential amplifier alone. The gain mechanism in the combination is usually explained as resulting from a reduction in the transistor analog of the "Miller" effect in the lower rank transistors, with the upper rank transistors not directly producing gain. The presence of degenerative resistances 32 and 33 are responsible for two or three decibels additional loss at full gain operation, bringing the gain of the first stage to about three db more gain than the second stage.

The buffer amplifiers 13, 14, 15, 16, 17, 18 serve the primary function of buffering the individual differential amplifiers by providing a high input impedance and low output impedance. They do not directly contribute to the voltage gain of the amplifier. A principal purpose of providing alternating buffers is to keep the gain of the amplifier essentially flat from the lowest frequencies to the higher frequency limits. If there is appreciably more gain at lower frequencies, then low frequency noise may be objectionable.

In the application of the present invention to a TV IF amplifier (where band shaping between each gain stage is avoided to reduce the need for continually going on and off an integrated chip), control of all out of band gain is an additional requirement. Introducing emitter followers between gain stages prevents the decreasing input impedance (which decreases with increasing frequency) from appearing across the resistive loads in the output of the previous stage, thus keeping the gain flat over an extended range. In the practical case of a TV IF amplifier , the rise in gain at low frequencies is kept below approximately 6 db, with the higher frequency limits being 46 megacycles.

AGC control is applied through resistors 61 and 61. Resistors 61 and 62 form a resistive divider for the application of the AGC source voltage (66) to the bases of transistors 36 and 37. By use of large resistances (10K), additional buffering action is achieved as between the a.c. signal in stage 1 of the cascode IF stage 1 and the AGC control buss.

The AGC characteristic of the amplifier is illustrated in FIG. 2. While the amplifier provides a total gain of approximately 53 db, gain control action provides in excess of 70 db of gain control. As illustrated in FIG. 2, the gain control characteristic consists of an initial steep portion 67, a central portion 68 of reduced slope and a terminal steep portion 69. The initial portion 67 provides in excess of 25 decibels of gain control, while the central portion accounts for approximately 4 or 5 db and the terminal portion 69 provides in excess of 40 db of control. The low slope central characteristic 68 is of particular value in a receiver wherein gain should be withdrawn from the RF stages in that it provides a large window for the delayed AGC threshold for said RF stage.

The foregoing AGC control characteristic is achieved by application of the AGC control voltage to the cascoded first stage 11 of the amplifier alone. The second stage 12 is not AGC controlled. In principle, gain control reduction of the cascode stage 11 is achieved by three separate effects, all of which occur in response to a reduction in the AGC control voltage applied to the bases of the upper rank transistors 36, 37.

The first and principal effect in the initial gain reduction characteristic 67 is achieved by saturation of the lower rank transistors 34, 35. Examination of the circuit of FIG. 1 discloses that the collectors of lower rank transistors 34, 35 are returned to the emitters of the upper rank transistors. If the base potentials of the upper rank transistors are reduced under the influence of a control voltage applied from the AGC source 66, then by emitter-follower action, the emitters of the upper rank transistors, and in turn the collectors in the lower rank will experience a corresponding reduction in voltage. Under maximum gain condition, the voltages at the bases of upper rank transistors 36, 37 are set to approximately 2 ½ volts. Allowing for a three-fourths volt drop in the junctions of the upper rank, the corresponding potential at the collectors of the lower rank transistors will be 1 ¾ volts. At the same time, the bases of the input buffer emitter-followers 13, 14 have a normal bias point of 2 ¾ volts. This bias point is established by their base currents in resistances 57, 58 and the drops of the two diodes 64, 65. By these connections, the bases of the lower rank transistors 34, 35 are returned through degenerative resistors 32, 33 to a point of approximately 2 volts. The emitters of the lower rank transistors at maximum gain conditions are 1 ¼ volts above ground potential.

The foregoing circuit provisions establish the necessary conditions for achieving sensitive AGC control as a result of saturation of the lower rank transistors 34, 35. Before the AGC voltage is initially reduced, the collector voltages at transistors 34, 35 are slightly above the potentials of the corresponding bases. Thus, the collector junction initially has the normal back-bias and the emitter junction the normal forward bias. As the AGC control potential reduces the collector potentials, however, the collector junction begins to lose its back-bias and to become forward biased. Thus, the transistors 34, 35 enter the collector saturation characteristic. This condition is accompanied by emission on the part of the collector and a change in the input junction characteristic.

This transition produces the initial sharp reduction in signal gain. It is normally explained as arising from a reduction in the current gain ($\beta$) of the transistors 34, 35. Since these transistors are in fact departing from their normal roles as base input signal amplifiers, when their collectors become forward biased, an explanation relying on beta alone is imperfect. The gain reduction effect is present, however, and is responsible for approximately 22 db of control range in the initial characteristic 67.

When substantial saturation effects are present, the input impedances of the transistor pair 34, 35 fall and the effects of degenerative resistances 32, 33 in enhancing the gain reduction action take place. This is the second principal effect in achieving gain control. Under maximum gain conditions, the base connected resistances 32, 33 produce approximately 2 – 3 db of gain reduction. This gain reduction results from input signal division between the base connected resistances 32, 33 and the relatively high impedance of the input junctions of the transistors 34, 35.

Typically, the resistances 32, 33 are small, being 110 ohms in one practical case. Assuming the beta ($\beta$) of the transistors to be approximately 20 and the series emitter resistance ($r_3$) to be 6 ohms, with the collector-emitter voltage ($V_{ce}$) exceeding a volt, the effective signal applied to the input of the differential amplifier is approximately 74 percent of the applied external signal, the effective product of $\beta r_e$ being approximately $j$ 120. Normally, the external base resistance should be selected to minimize gain and noise figure loss at the high gain bias point of the amplifier and the 110 ohms selected for the base resistances 32 and 33 is significantly smaller than the $j$ 120 $\beta r_e$ product of the transistors, and thus a suitable value.

As the transistors 34, 35 are driven into saturation by gain control action, their input impedance lowers drastically and base connected resistances 32, 33 become an appreciable series loss element. Referring to FIG. 2, the effect of degeneration begins to take place during lower rank saturation (67), becomes more pronounced during the low slope portion 68, and continues to have an appreciable effect into the final region 69.

When $V_{ce}$ at the transistors 34, 35 are reduced under the influence of the gain control voltage, the input impedance of the amplifier is reduced with respect to the 110 ohm degenerative base resistors, partly as a result of reduced $\beta$ and partially because of the forward biasing of the collector base junction which provides a low impedance feedback network from input to output. The practical reduction in gain from the 110 Ω series loss element is about 15 db.

In addition to the desired gain control action, the presence of resistors 32 and 33 tends to linearize the gain of the amplifier and greatly improve its dynamic range under conditions of high input signal levels by causing most of the input signal to appear across the linear degenerative resistors 32, 33.

At about the point where the low slope characteristic 68 transitions into the final steeply sloping regions 69, the third gain control effect occurs. This effect occurs first as a result of a reduction in current in the upper rank transistors 36, 37 and finally from reverse biasing of the input junctions. Referring to FIG. 2, the emitters of cascode transistors 36, 37 derive their current from the collectors of their lower rank transistors 34, 35. Thus, a reduction in current in lower rank transistors 34, 35 produce a corresponding reduction in emitter current in upper rank transistors 36, 37. At the same time the base voltages of upper rank transistors 36, 37, under AGC control, may be driven below their emitter voltages, thereby reversing the bias of their input junctions. Viewing the cascoded transistors 36, 37 as signal amplifiers, the bases are at signal ground and signal currents are injected into the emitters. Thus, the mechanism for signal transfer from emitters to the collectors of these transistors involves current multiplication by the near unity alpha of these transistors. As the transistors are driven into a condition of reduced current and reversed input bias, two effects take place. The alphas of the transistors may be regarded as falling, and at the same time the input junction, which is now becoming reversely biased departs from its classic current amplification mode and becomes a parasitic divider loss pad. As a result of these two effects, signal transfer to the collectors is reduced. Approximately 35 db of additional gain reduction results from this phenomenon.

The foregoing combination in which the first amplification stage 11 provides substantially all of the gain control action and the second gain control stage 12 is left uncontrolled transfers the problems of maintaining low noise, wide dynamic range and accurate differential balance from the second stage to the first. Since the second stage is operated full gain it may always operate in a basically low noise condition and it can retain its normal wide dynamic range. Similarly, the differential balance control is not affected in this stage.

These problems now focus in the first amplification stage 11. It may be recalled that the first rank transistors 34, 35 produce forward gain control action and that the upper rank transistors 36, 37 provide reverse gain control action. Forward gain control action with the degenerative resistance 32, 33 permits the first rank to operate in a low noise mode since at maximum gain there is very little gain reduction in these resistances. At the same time, the degenerative configuration enhances the dynamic range of the stage producing very low intermodulation distortion. Approximately 2 db sacrifice in noise figure permits an increase in dynamic range of 15 db. The reverse AGC action of the cascoded upper rank transistors 36, 37 does not aggravate the noise characteristic of the stage, and the dynamic range of the composite amplifier remains unimpaired.

The use of interstage emitter follower buffer amplifiers (13 through 18) between the two amplifier stages (11 and 12) is particularly advantageous in achieving wide band operation as pointed out earlier. The amplifiers 11 and 12 ordinarily have an upper frequency response of approximately 2 – 4 megahertz measured at the 6 db point. With the introduction of the emitter followers, the corresponding upper frequency response is in the vicinity of 50 megahertz, a very substantial improvement in high frequency response.

Since feedback is essential in the amplifier to provide a correction for any d.c. offset, a feedback loop is essential. It must, however, not create instability; it must not cause appreciable common mode drift in the input circuits; and finally, it must be effective under all conditions of automatic gain control operation.

In the foregoing configuration, the d.c. feedback loop has a low pass filter characteristic having a time constant of approximately 25 microsec. High frequency instability is prevented by attenuating the feedback as the frequency increases, which reduces the feedback well below unity (closed loop gain) and provides unconditional stability. This approach also assures stability under gain control action wherein phase variations are most likely to occur in the forward gain portion of the amplifier.

Temperature induced common mode drift in the output of stage 21 is designed to compensate the temperature induced common mode drift of stage 11. The voltage output of 21 is established by the buffer amplifier current flow through resistors 57, 58 to which the voltage drop in two forward biased junctions 64, 65 is added. Similarly, the potential at the bases of emitter followers 13 and 14 of stage 11 corresponds to the drop in resistance 38 resulting from emitter current flow from transistors 34, 35 to which two successive voltage drops from junctions 33, 34; 14, 35 are added. The configuration insures that the current in stage 11 is temperature independent. In addition, this configuration provides rejection of power supply variations from appearing at the output.

Finally, the d.c. balance circuit does not lose control as the first stage is subject to strong AGC gain reduction. This is prevented by applying the d.c. unbalance feedback to the bases of the input emitter followers 13, 14. For the high frequency input signal, the stages 13 and 14 are pure emitter followers, their collectors being returned to ground through large bypass capacitors. For low a.c. frequencies and d.c. there is a pair of small (220 ohm) load resistances inserted between the collectors of 13, 14 and the B+ source. Accordingly, when a d.c. unbalance feedback signal is applied to the bases of the stages 13 and 14, a corresponding d.c. unbalance component is translated to the junctions of collector load resistances 27, 38, 28, 39).

When lower rank stages 34, 35 are as yet unsaturated, the effect of these translated d.c. unbalance components upon the overall d.c. balance of the amplifier is negligible. The d.c. forward gain of the amplifiers 13, 14 is kept small by the large degenerating emitter resistances 30, 31 and by the selection of collector load resistances 27, 28, which are small in relation to the total loads of the outputs of the amplifier 11. Thus, the d.c. unbalance correction acts directly upon the lower rank transistors 34, 35 until they become saturated.

However, when the lower rank transistors 34, 35 go into saturation with strong AGC control, these translated d.c. unbalance components at the output of buffer stages 13 and 14 come into play to continue to maintain the d.c. balance of the overall amplifier.

When the lower rank transistors 34, 35 go into saturation, collector current in the upper rank transistors 36 and 37 falls. Finally, the current flowing through the upper rank transistors 36, 37 becomes so small that the voltage developed across the collector load resistors (27, 38; 28, 39) is too small to overcome the normally expected d.c. offset in stage 12. At this point, directly translating the d.c. unbalance signal at the bases of transistors 34, 35 to the output of the first stage 11 provides the necessary feedback voltage at the input of the second stage 12 to maintain proper d.c. balance of the second output.

The amplifier which has been so far described is fully d.c. coupled throughout and will amplify a signal at television intermediate frequencies (44 meg.) in a balanced fashion. The amplifier is characterized by a highly symmetrical output and by an excellent phase response throughout the customary frequency spectrum. These relationships persist even in the presence of a high degree of automatic gain control. Furthermore, programming the gain control action in the manner indicated through successive stages, preferably including the tuner, holds the average sensitivity of gain control action to an approximately constant value. This property keeps the response time of the AGC loop constant for all gain settings and is helpful in reducing the detrimental effect of external influcnes such as airplane flutter.

What I claim as new and desire to secure by Letters Patent of the United States is:

1. An amplifier of controllable gain comprising:

a. a first pair of transistors each having base, emitter and collector electrodes connected in differential amplifier configuration, said transistors being biased to have a low initial collector-emitter voltage($V_{ce}$) for sensitivity to collector saturation effects, the input signal being applied to said bases, each presenting a characteristic input impedance to signals differentially coupled to said bases, said input impedance decreasing as a function of the collector-emitter voltage ($V_{ce}$), b. resistance means in the base signal path of each transistor having a value which is comparable to said input impedance for producing a division in applied input signal between said resistance means and the input impedances of said transistors;

c. a second pair of transistors each having base, emitter and collector electrodes connected in cascode with said first transistor pair, the emitters of said second pair being coupled to the collectors of said first pair; the output signal appearing at the collectors of said second pair, and d. a source of gain control voltage coupled to the bases of said said second transistor pair, said gain control voltage reducing the base potential thereof and by emitter-follower action the collector-emitter potentials ($V_{ce}$) of the first transistor pair whereby the gain control voltage successively produces gain reduction by saturation of said first transistor pair, by increasing degeneration as the ratio between said resistance means and said first input impedances increase as said first transistor pair saturates, and, finally, by driving said second transistor pair into cut-off.

2. An amplifier as set forth in claim 1 wherein said resistance means are a pair of external base connected resistances.

3. An amplifier as set forth in claim 2 having in addition thereto, a. an additional pair of transistors for signal amplification, each having base, emitter and collector electrodes connected in differential amplifier configuration, b. means for coupling the output signal from said second transistor pair to the bases of said additional transistor pair in push-pull, c. a feedback network to which the output of said additional transistor pair is coupled for providing an unbalance signal to compensate for d.c. offset in signal amplification, and d. a pair of transistor input buffer amplifiers in base input-emitter follower configuration, the emitters thereof being connected to ground through separate current stabilizing resistances and to the bases of said first transistor pair for application of the signal and said unbalance signal to the bases of said first transistor pair, the collectors of said buffer amplifiers being bypassed to ground by a capacitor having low impedance at input signal frequencies and being connected through a d.c. path to the output of said second transistor pair for transfer of said unbalance signal to maintain d.c. balance when said first transistor pair saturates.

4. An amplifier as set forth in claim 3 wherein said feedback network further includes an output buffer amplifier comprising a pair of transistors in emitter follower configuration, the emitters thereof being coupled to the bases of said input buffer amplifiers and returned to ground through a path comprising resistance means and a pair of serially connected forward biased diodes for compensating the temperature induced drift of said cascoded first and second transistor pair.

* * * * *